United States Patent
Balu et al.

(10) Patent No.: US 9,557,396 B2
(45) Date of Patent: Jan. 31, 2017

(54) DUAL CONTRAST VESSEL WALL MRI USING PHASE SENSITIVE POLARITY MAPS

(71) Applicant: University of Washington, Seattle, WA (US)

(72) Inventors: Niranjan Balu, Redmond, WA (US); Jinnan Wang, Seattle, WA (US); Chun Yuan, Bellevue, WA (US)

(73) Assignees: University of Washington, Seattle, WA (US); Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/676,642

(22) Filed: Apr. 1, 2015

(65) Prior Publication Data
US 2016/0291110 A1 Oct. 6, 2016

(51) Int. Cl.
*G06K 9/00* (2006.01)
*G01R 33/50* (2006.01)
*G06T 11/00* (2006.01)
*G01R 33/565* (2006.01)

(52) U.S. Cl.
CPC .......... *G01R 33/50* (2013.01); *G01R 33/56509* (2013.01); *G06T 11/005* (2013.01)

(58) Field of Classification Search
CPC .. G01R 33/50; G01R 33/56509; G06T 11/005
See application file for complete search history.

(56) References Cited

U.S. PATENT DOCUMENTS

| | | | | |
|---|---|---|---|---|
| 5,541,514 A | * | 7/1996 | Heid | G01R 33/561 324/309 |
| 6,023,634 A | * | 2/2000 | Hanawa | G01R 33/54 324/307 |
| 2003/0095147 A1 | * | 5/2003 | Daw | G01R 33/56 715/771 |
| 2007/0053554 A1 | * | 3/2007 | Fayad | A61B 5/055 382/128 |
| 2007/0255129 A1 | * | 11/2007 | Du | G01R 33/4824 600/410 |
| 2010/0013475 A1 | * | 1/2010 | Kimura | A61B 5/055 324/307 |

(Continued)

OTHER PUBLICATIONS

Balu, Niranjan et al., *Dual Contrast Vessel Wall MRI using Phase Sensitive Polarity Maps*, Proceedings of the 22nd Scientific Meeting and Exhibition, International Society of Magnetic Resonance in Medicine, Milan, Italy 2014.

(Continued)

*Primary Examiner* — Amara Abdi
(74) *Attorney, Agent, or Firm* — Kilpatrick Townsend and Stockton LLP

(57) ABSTRACT

Methods and systems for using magnetic resonance (MR) imaging include obtaining a T1-weighted MR image and a proton-density (PD) weighted MR image from a dual-image acquisition following an inversion-recovery (IR) pulse. The T1-weighted and PD-weighted images are used to obtain a polarity function describing a positive or negative polarity at individual voxels, which is used to reconstruct a polarity-enhanced PD-weighted image from the PD-weighted image. The polarity-enhanced PD-weighted image can be used for assessing at least plaque burden and juxtaluminal calcification (JCA).

21 Claims, 9 Drawing Sheets

(56) References Cited

U.S. PATENT DOCUMENTS

2012/0251443 A1* 10/2012 Ozaki ................ A61K 49/1896
424/1.65
2015/0131884 A1* 5/2015 Kimura ................ A61B 5/055
382/131

OTHER PUBLICATIONS

Balu, Niranjan et al., *Assessment of calcification size and juxtaluminal status using gray-blood 3D vessel wall MRI*, Proceedings of the 23$^{rd}$ Scientific Meeting and Exhibition, International Society of Magnetic Resonance in Medicine, Toronto, Canada 2015.

* cited by examiner

US 9,557,396 B2

DUAL CONTRAST VESSEL WALL MRI USING PHASE SENSITIVE POLARITY MAPS

GOVERNMENT SUPPORT

This invention was made with government support under grant nos. R01 HL103609 and R21 NS072464, awarded by the National Institutes of Health. The government has certain rights in the invention.

BACKGROUND OF THE INVENTION

Thromboembolism from carotid atherosclerotic plaque is a major cause of mortality and morbidity from stroke. Plaques that are most likely to cause thromboembolism may exhibit high-risk features such as stenosis, large plaque burden, intraplaque hemorrhage (IPH) and juxtaluminal calcification (JCA). Features of the above high-risk features have been obtainable separately using magnetic resonance MR imaging technologies. Stenosis is the reduction in artery lumen size relative to the normal lumen size expected at that location and can be indicative of plaque size at that location. Plaque burden is a direct measurement of plaque size and is independent of stenosis measurement. IPH is blood or blood constituents within the plaque and is indicative of advanced atherosclerotic disease. While calcification can exist in many locations within the plaque, JCA refers to calcification which is adjoining the lumen. JCA can potentially cause thromboembolism. Recently a phase-sensitive inversion-recovery (IR) based sequence called Simultaneous Non-contrast Angiography and IntraPlaque Hemorrhage (SNAP) MRI was developed to simultaneously image stenosis and IPH. While SNAP MRI is sufficient for measuring stenosis and imaging IPH, further improvements are desired to identify other high risk plaque features such as juxtaluminal calcification (JCA) and large plaque burden.

BRIEF SUMMARY OF THE INVENTION

The following presents a simplified summary of some embodiments of the invention in order to provide a basic understanding of the invention. This summary is not an extensive overview of the invention. It is not intended to identify key/critical elements of the invention or to delineate the scope of the invention. Its sole purpose is to present some embodiments of the invention in a simplified form as a prelude to the more detailed description that is presented later.

Embodiments herein described relate to methods, and systems for obtaining a reconstructed proton-density weighted image, herein referred to as an $S_2$ image. Generation of the $S_2$ image does not require additional scan time. In some embodiments, the methods and systems may obtain T1-weighted and proton-density (PD) weighted images ($I_1$ and $I_2$ images, respectively) from a single magnetic resonance (MR) sequence, obtain a polarity map $P(x,y)$ using the $I_1$ and $I_2$ images, and apply a reconstructing function to the $I_2$ image using the polarity map to obtain the $S_2$ image.

Some additional embodiments include methods and systems for identifying characteristics of high-risk plaques using the $S_2$ image alone and in combination with one or more of: a reconstructed T1-weighted image $S_1$, a bright-blood $S_1$ image obtained as the negative part of the T1-weighted image $S_1$ ($S_1(x,y)<0$); and the $I_2$ image. Characteristics which can be identified from the above images, which can be obtained from a single IR sequence, include at least plaque burden, stenosis, IPH, and JCA.

Some additional embodiments include methods for using T1-weighted and PD-weighted magnetic resonance images $I_1$ and $I_2$ (respectively). The $I_1$ and $I_2$ images may be used to obtain a polarity map $P(x,y)$ corresponding to a polarity function indicating a positive or a negative direction of magnetization associated with each voxel (spatial pixel or spatial coordinate) in the $I_1$ and $I_2$ images. By correcting the $I_2$ image with the polarity map, an $S_2$ image can be obtained, such that $S_2$ is a polarity-enhanced proton-density-weighted image; and this $S_2$ image can be displayed in a manner perceptible to a user. The $S_2$ image is indicative of at least one of a calcification or a plaque burden. With $S_1$ and bright-blood $S_1$ images developed from the same $I_1$ and $I_2$ images, all of plaque burden, stenosis, IPH and JCA may be obtained from the same $I_1$ and $I_2$ image set.

For a fuller understanding of the nature and advantages of the present invention, reference should be made to the ensuing detailed description and accompanying drawings.

BRIEF DESCRIPTION OF THE DRAWINGS

These and other features, embodiments, and advantages of the present disclosure are better understood when the following Detailed Description is read with reference to the accompanying drawings.

DETAILED DESCRIPTION OF THE INVENTION

Figure 1:
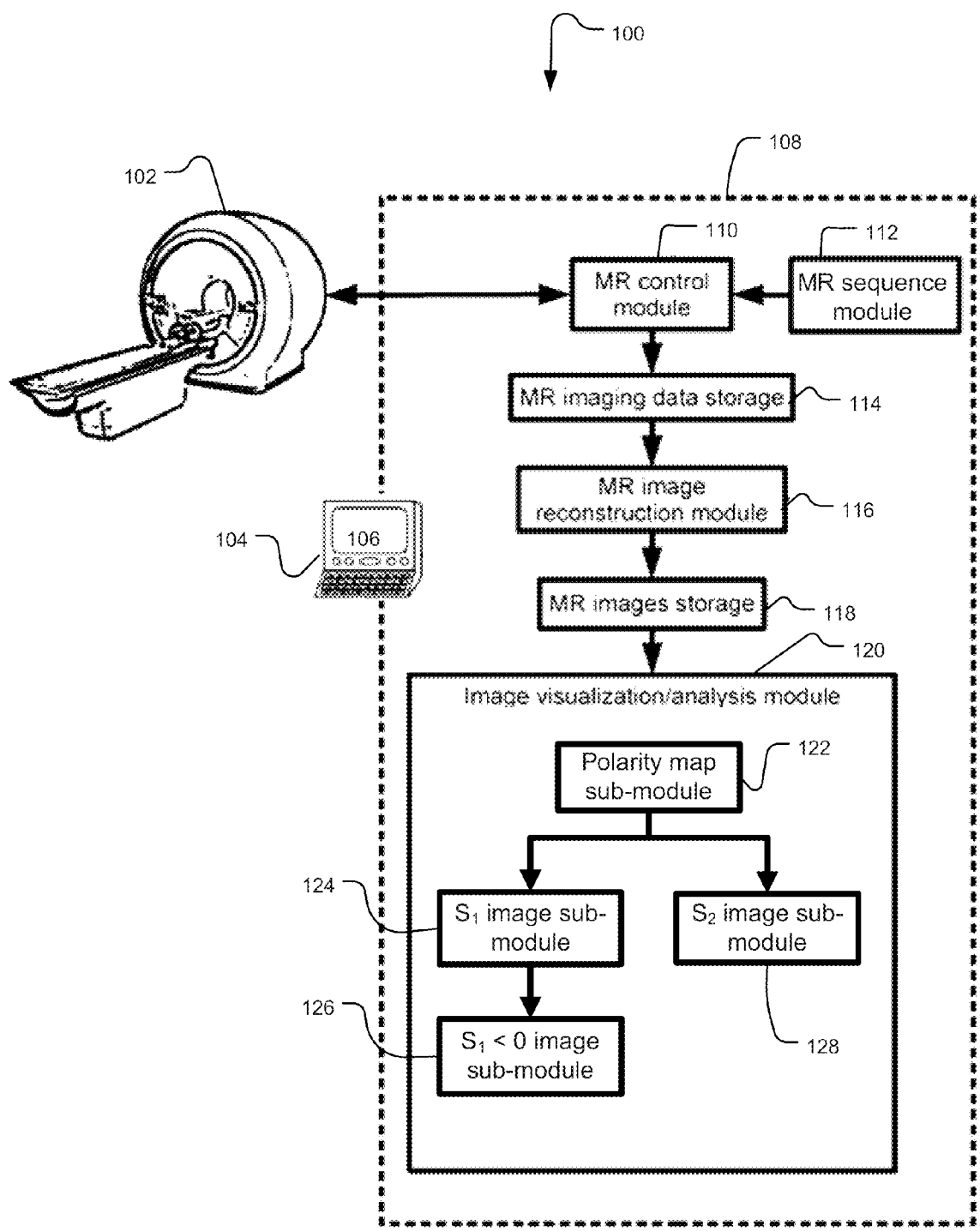
FIG. 1 is diagrammatic illustration of a magnetic resonance imaging system for performing dual contrast imaging, in accordance with embodiments.

In the following description, various embodiments of the present invention will be described. For purposes of explanation, specific configurations and details are set forth in order to provide a thorough understanding of the embodiments. However, it will also be apparent to one skilled in the art that the present invention may be practiced without the specific details. Furthermore, well-known features may be omitted or simplified in order not to obscure the embodiment being described.

In some procedures, magnetic resonance imaging (MR imaging or MRI) can obtain data on the internal structure of a subject. For example, SNAP MRI operates by using an inversion recovery gradient echo MRI sequence and collecting two images. A first image is collected at a time $TI_1$ and at a flip angle α calibrated to produce a T1-weighted image, or $I_1$ image. In a T1-weighted image, fatty tissues tend to appear bright and fluids tend to appear dark (or hypointense). A second image is collected after a delay and at a flip angle θ, such that significant magnetic relaxation occurs in the targeted tissues, producing a proton-density (PD) weighted image, or $I_2$ image. By applying a phase-sensitive reconstruction to the T1-weighted image, the SNAP MRI method produces a highly T1-weighted corrected image or $S_1$ image, suitable for identifying features of plaque such as IPH and stenosis.

Embodiments herein disclosed include a process for resolving a corrected black-blood PD-weighted image, or $S_2$ image, for plaque burden and JCA assessment. Stenosis may result from causes other than atherosclerotic plaque. Therefore direct identification of plaque using the $S_2$ image can correctly identify atherosclerotic plaque and also measure its size. While IPH is indicative of high risk and late stage atherosclerosis, thromboembolism can occur due to other cause even without IPH. JCA has been identified as an important cause of thromboembolism. In addition to JCA, this process can also detect all plaque calcifications (only some of which may be JCA). Thus an important aspect of embodiments is that JCA can be distinguished from other calcifications. By using the T1-weighted image ($I_1$) and the PD-weighted image ($I_2$), a phase-sensitive polarity map can be generated. By applying the polarity map to $I_2$, a proton-density-weighted corrected gray-blood image can be generated, which shows both the lumen and outerwall boundaries of an artery or vessel, thus permitting the detection of at least plaque burden and calcification, and allowing determination of whether calcification is JCA, without necessitating additional data collection beyond the $I_1$ and $I_2$ images. Advantageously, in many embodiments, the additional information for assessing plaque burden and/or calcification can be provided without any increase in scan time compared to the phase-sensitive inversion-recovery based sequence.

Combined use of the $S_2$ image and $I_2$ images can also permit a practitioner to exclude artifacts related to blood-flow, thus improving the accuracy of calcification and JCA assessment. Furthermore, assessment for stenosis and luminal surface characteristics, such as IPH, can be obtained from the $S_1$ image. Thus, at least four major indicia of high-risk plaque (IPH, Stenosis, JCA and plaque burden) can be determined from images obtained in the same MRI sequence.

Referring now to the drawings, in which like reference numerals represent like parts throughout the several views, FIG. 1 shows an MR imaging system 100 for performing a dual-contrast MR imaging sequence, in accordance with embodiments. The MR imaging system 100 includes an MR scanner 102 for obtaining MR image data from a subject, under the control of an MR control module 110 that executes an inversion-recovery imaging sequence stored in an MR sequence module 112.

The MR scanner 102 may be an MR imaging device having the capability of initiating an IR pulse. A whole body clinical MRI scanner is generally sufficient that possesses a commercially available field strength (for example, 1.5 T or 3 T), a receiver RF coil (generally dedicated for use in imaging a particular anatomy), and a reconstruction computer and associated software. Software programs configured for reconstructing the images associated with the method generally must be tailored to the particular MR scanner, and can be programmed directly on the scanner or on an associated computer workstation 104, and displayed at a computer workstation display 106.

Data obtained from the MR imaging sequence is stored in an MR imaging data storage module 114, and may be reconstructed by an MR image reconstruction module 116 into MR images (including at least an $I_1$ and $I_2$ image) and stored in an MR images storage module 118. The image visualization/analysis module 120 may construct corrected images from the images stored in the MR image storage module 118. The image visualization/analysis module can process the stored MR images to construct a polarity map in the polarity map sub-module. $S_1$ and $S_2$ images (T1-weighted and PD-weighted images, respectively) can be constructed at the $S_1$ image sub-module and the $S_2$ image sub-module, respectively, using the stored MR images in the MR images storage 118 and with the polarity map developed at the polarity map sub-module 122. A bright-blood $S_1$ (corrected T1-weighted) image $S_1$<0 can be developed from the $S_1$ image at the $S_1$<0 image submodule 126. Any or all of the above-referenced images can be displayed at the computer workstation display 106 or at any other display. Any or all of the image visualization and analysis modules and techniques described above may be embodied in a nontransitory data storage medium, in random access memory (RAM) or other any other storage medium which stores instructions executable by the associated computer workstation 104 or by a dedicated computing unit (not shown) associated with the MR scanner.

Figure 2:
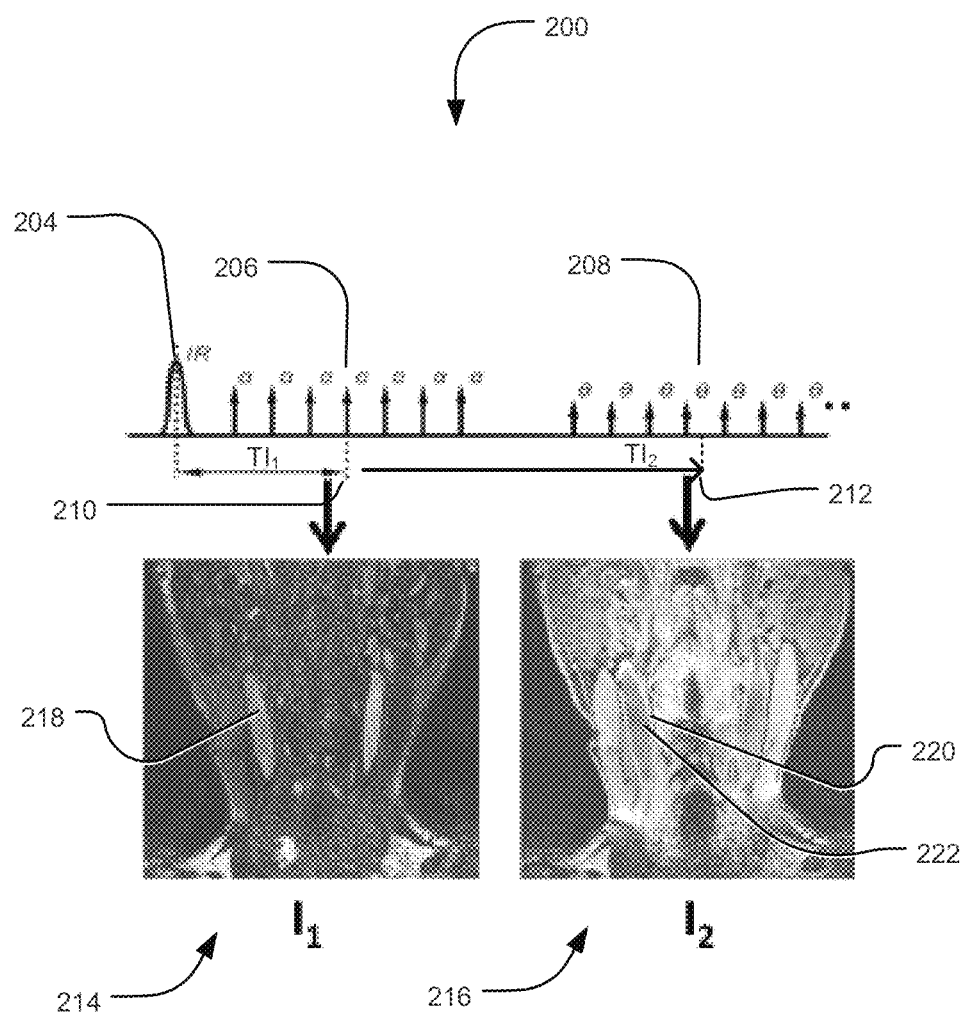
FIG. 2 is a simplified schematic illustrating parameters for obtaining an $I_1$ and an $I_2$ image, and examples of an $I_1$ and $I_2$ image, from a single MR sequence, in accordance with embodiments.

FIG. 2 is a simplified schematic illustrating aspects of a procedure 200 for obtaining the $I_1$ and an $I_2$ images referenced above, and examples of $I_1$ and $I_2$ images 212 and 214, from a single MR sequence, in accordance with embodiments of the present invention.

In the procedure 200, the $I_1$ image 214, which is T1-weighted, is obtained by detecting a first magnetic resonance signal at a time $TI_1$ 210 after an inversion-recovery pulse (IR pulse) 204. In some embodiments, the IR pulse can be an IR gradient echo MR imaging sequence, with two different inversion times $TI_1$ and $TI_2$, two flip angles α and θ, a turbo factor of 98, and a scan time of approximately 5 minutes. In the procedure 200 shown in FIG. 2, the $I_1$ image is obtained at time $TI_1$ of approximately 500 ms after the inversion pulse and at an acquisition flip angle α 206 of approximately 11 degrees, configured to provide a T1-weighted image. Features visible on the $I_1$ image include, for example, blood appearing relatively bright 218. The $I_2$ image 216, which is PD-weighted, is obtained by detecting a second magnetic resonance signal at a time $TI_2$ 212 after the IR pulse 204 and at acquisition flip angle θ in the same sequence. The $I_2$ image 216 is obtained at an acquisition flip angle θ 208 of approximately 5 degrees, selected for acquiring a PD-weighted image. Features visible on an $I_2$ image include, for example, vessel outer and inner boundaries 220 and 222, respectively. In various embodiments, the parameters of the IR sequence may vary. In a specific embodiment, the $I_1$ and $I_2$ images 214, 216 are obtained using a slab-selective inversion with linear encoding. The image shows one coronal MRI slice through the carotid artery. The full dataset contains a stack of slices constituting a 3D volume spanning the full carotid artery. The same technique can be applied to other arteries in a similar fashion.

In embodiments, the angle α may be any suitable angle for T1-weighted image acquisition. For example, angle α may be between 9-25 degrees, preferably between 10-12 degrees, and even more preferably 11 degrees. Similarly, angle θ may be any suitable angle for PD-weighted image acquisition. For example, angle θ may be between 3-7 degrees, preferably between 4-6 degrees, and even more preferably 5 degrees. The times $TI_1$ and $TI_2$ are typically very short and relatively long, respectively; and the scan cycle repetition time TR may be any suitable time for obtaining MR imaging data according to the parameters above, but in specific embodiments: $TI_1$ may be approximately 400 ms, or within a range of approximately 300 ms to 500 ms, after the IR pulse. $TI_2$ for obtaining PD-weighted data may be on the order of 1.5 seconds or more after the IR pulse.

Figure 3:
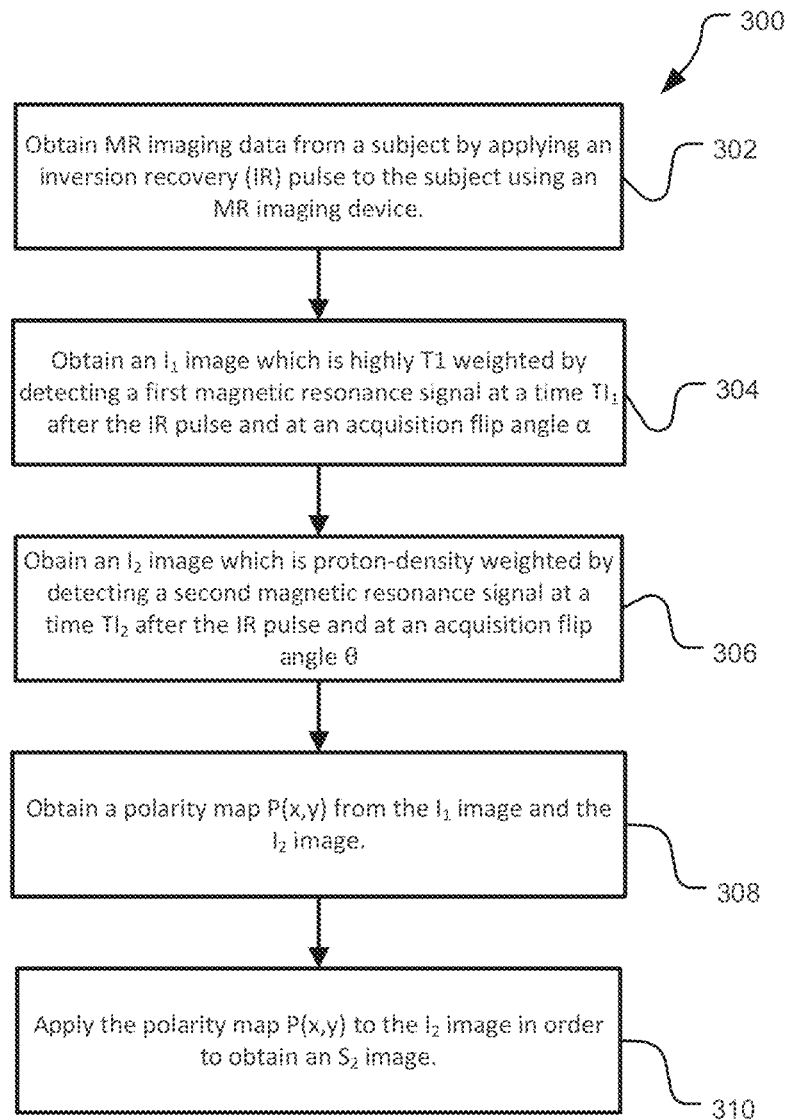
FIG. 3 is a process flow diagram showing an example process for obtaining an $S_2$ image using a polarity map, in accordance with embodiments.

FIG. 3 shows a process flow diagram showing an example process 300 for obtaining an $S_2$ image using a polarity map, in accordance with embodiments. In the process 300, MR imaging data is obtained from a subject by applying an inversion gradient echo MRI sequence (IR sequence) to the patient using an MR imaging device 302, as described above. The data is used to obtain two images: an $I_1$ image and an $I_2$ image.

After obtaining $I_1$ and $I_2$ images in accordance with the process 300, a phase-sensitive polarity map P(x,y) is obtained from the $I_1$ and $I_2$ images 108 according to the following equations.

$$I(x, y) = \| I(x, y) \| P(x, y) e^{-\emptyset(x,y)}$$

and $$P(x, y) = \frac{I_1(x, y) I_2^*(x, y)}{\| I_1 \| \| I_2 \|}.$$

*Denotes complex conjugation

In the equations above, Ø(x,y) denotes the total background phase, and P(x,y) is the polarity function which has values of −1 or +1 depending on the longitudinal magnetization.

Thereafter, the polarity map P(x,y) can be used to produce at least two reconstructed images, $S_1$ and $S_2$. In accordance with the process 200, the $S_2$ image, which is a polarity enhanced PD-weighted image, is obtained 210 by applying the polarity map P(x,y) to the $I_2$ image, as follows:

$$S_2(x,y)=P(x,y)\|I_2(x,y)\|$$

In addition, an $S_1$ image, which is a T1-weighted corrected real image, can be obtained by applying the polarity map P(x,y) to the $I_1$ image:

$$S_1(x,y)=P(x,y)\|I_1(x,y)\|$$

Additionally, a bright-blood $S_1$ image ($S_1$<0) can be obtained as the negative part of $S_1$.

Tissues having magnetization properties with the same magnitude but opposite polarity can be difficult to differentiate using the $I_1$ or $I_2$ images alone, because the intensity of voxels (spatial pixels) within an image depends on the magnitude. The polarity map differentiates between positive and negative magnetization in $I_1$ (noting that polarity is restored in $I_2$ at the time of image acquisition). Accordingly, images enhanced using the polarity map (corrected real image $S_1$ and polarity-enhanced image $S_2$) can present contrast beyond that of the $I_1$ or $I_2$ images.

Figure 4:
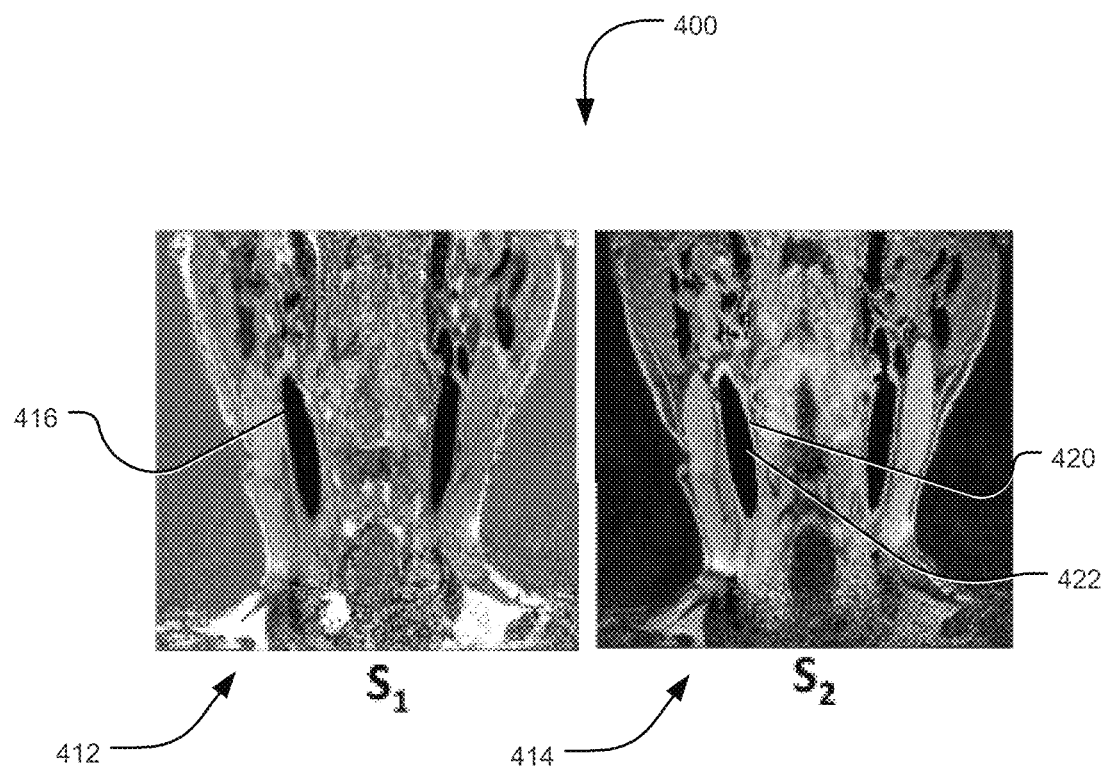
FIG. 4 is an exemplary view of $S_1$ and an $S_2$ images derived from the $I_1$ and $I_2$ images shown in FIG. 2, in accordance with embodiments.

FIG. 4 is an exemplary view side-by-side comparison 400 of $S_1$ and an $S_2$ images 412 and 414, respectively, derived from the $I_1$ and $I_2$ images 214 and 216 shown in FIG. 2, in accordance with embodiments. The $S_1$ image has been reconstructed using the polarity function P(x,y) to obtain a black-blood image showing the vessel lumen 416. The $S_2$ image, also reconstructed using the polarity function P(x,y), shows the vessel lumen 422, but additionally resolves a vessel outerwall boundary 420.

Figure 5:
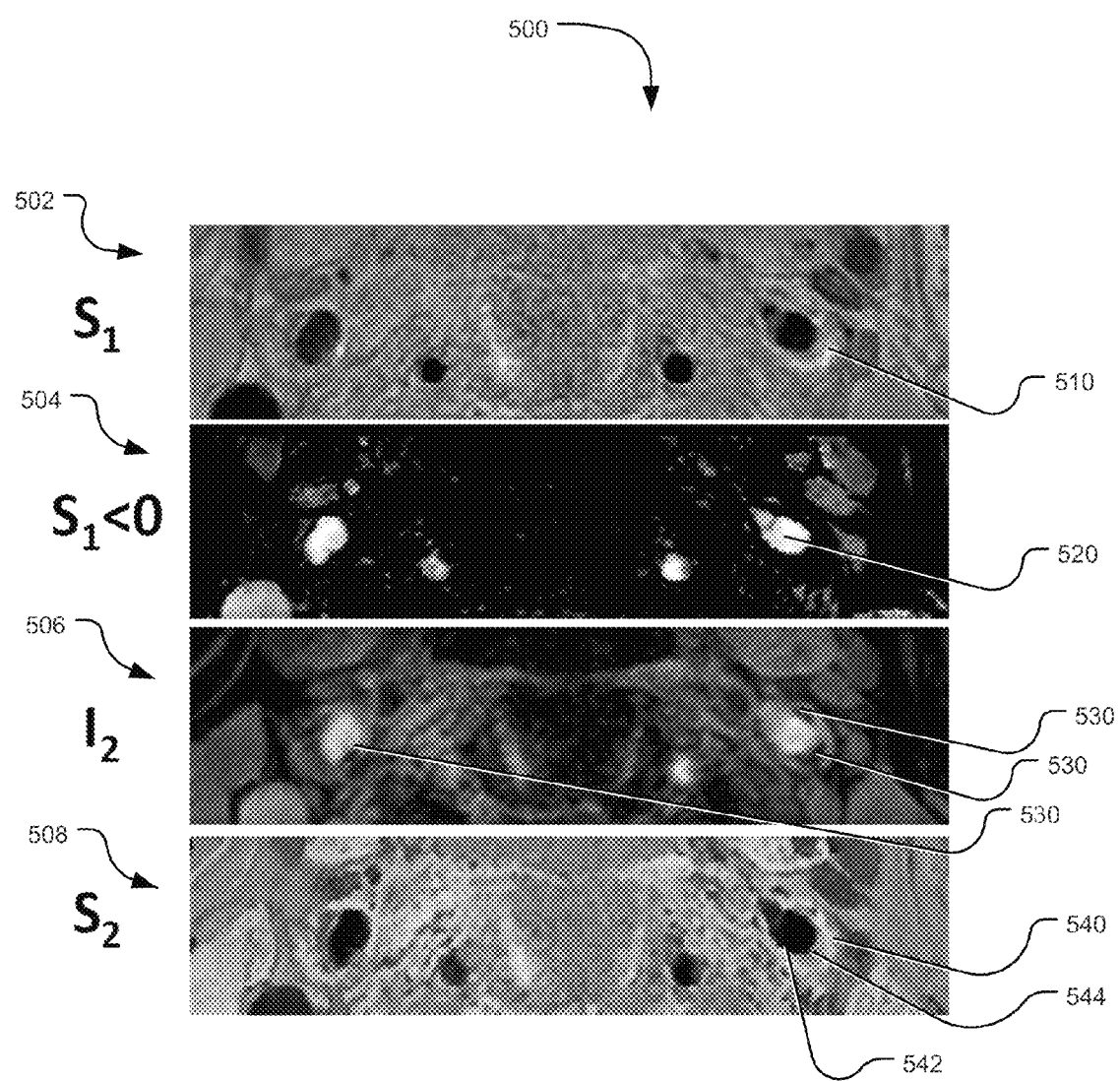
FIG. 5 is an exemplary view of four images useful for identifying high-risk plaques, obtainable from a single MR sequence on a patient, in accordance with embodiments.

FIG. 5 is an exemplary view of a side-by-side comparison 500 of four images useful for identifying high-risk plaques, obtainable from a single MR sequence on a patient, in accordance with embodiments. The comparison 500 includes: an $S_1$ image 502, a bright-blood $S_1$ image ($S_1$<0) 504, a PD-weighted image $I_2$ 506, and an $S_2$ image 508; obtainable by the methods described above. The four images being generated from the same sequence enables a user to have confidence that physiological variance is absent as between the images, with the result that differences between the images are attributable only to the effects of each acquisition type and processing method on the contrast. Furthermore, co-registration between images may permit a user to perform a voxel-by-voxel comparison between images, to overlay images, to remove artifacts or resolve fine details.

In accordance with embodiments of the comparison 500, vessel lumens appear as dark spaces in the $S_1$ image 502; and bright points adjacent to lumens represent points of interest 510 for determining IPH. After identifying such points of interest, a practitioner can use the bright-blood $S_1$ image 504 to determine a vessel lumen 520 and determine whether the point of interest falls outside the lumen by comparing an area of the lumen 520 and the position of the point of interest 510. Where a point of interest 510 falls outside but proximate to a vessel lumen 520, the point is a likely site of IPH.

In the comparison 500, the $I_2$ image 506 provides a gray-blood image, and the $S_2$ image 508 provides a black-blood image in which the vessel lumen 542 and vessel outerwall 540 are visible. Dark regions 530 on $I_2$ 506 and between the vessel lumen and outerwall correspond to points of interest likely to represent calcification. Where calcification is adjacent to the lumen, the calcification is indicative of JCA. The $S_2$ image is useful for resolving the plaque burden 544 as a mid-intensity space between the outerwall boundary 540 and the inner lumen 542. Resolving the plaque burden in this way permits a practitioner to view calcification as a hypointense inclusion against the plaque boundary, and to determine, for example, whether such an inclusion is indicative of JCA or of intraplaque calcification. Calcification being visible as dark regions in $S_2$ as well as $I_2$ may allow a practitioner to exclude artifacts or false-positive calcification sites by comparing the $I_2$ and $S_2$ images.

Figure 6:
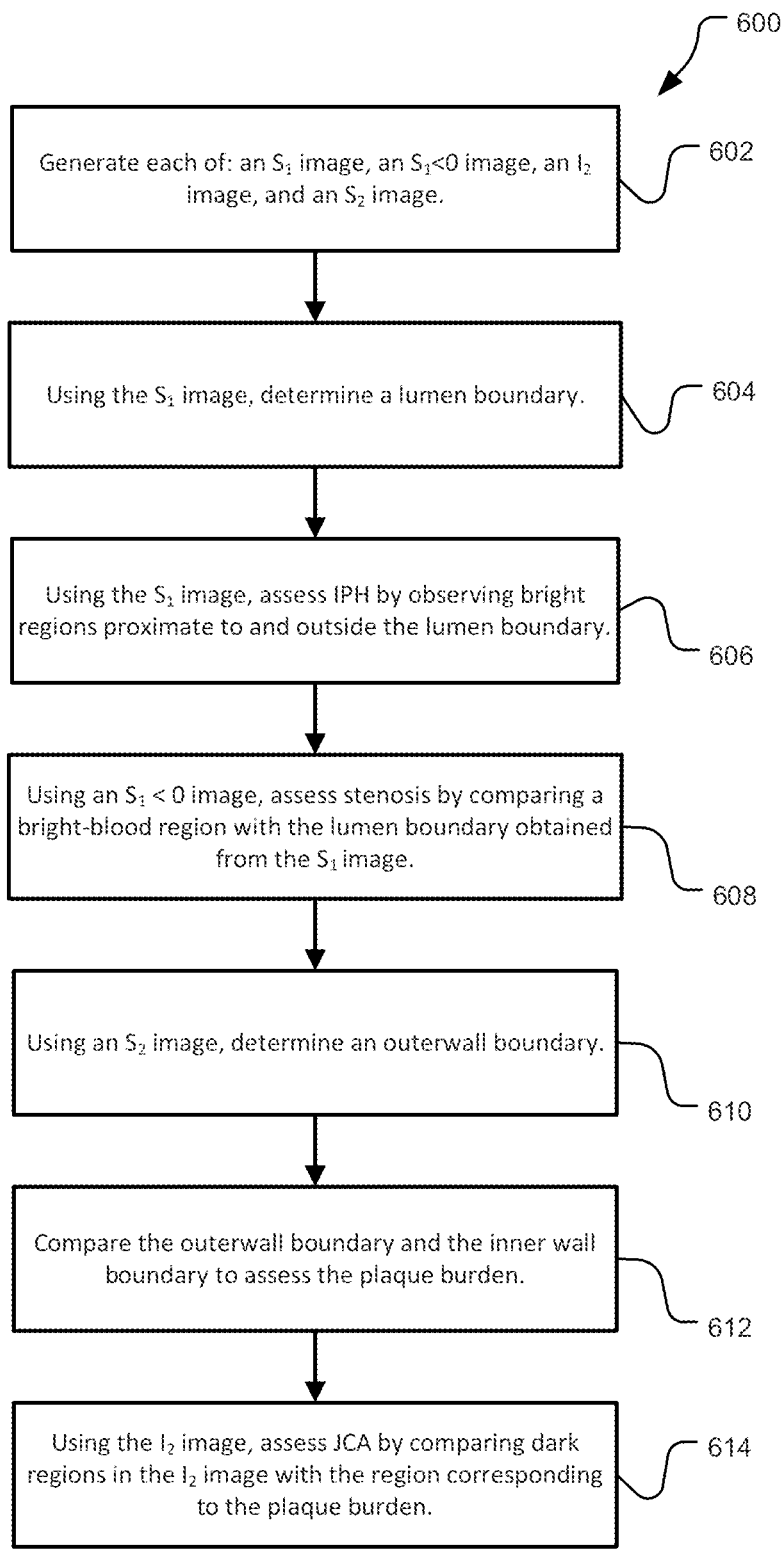
FIG. 6 is a process flow diagram showing an example process for identifying high-risk plaques using the four images reconstructed from a single MR sequence shown in FIG. 5.

FIG. 6 is a process flow diagram showing an example process 600 for identifying high-risk plaque using the four images reconstructed from a single MR sequence shown in FIG. 5. In the process 600, each of an $S_1$ image, bright-blood $S_1$ image, $I_2$ image, and $S_2$ image are generated 602 in accordance with embodiments. The $S_1$ image is used to determine a lumen boundary 604, and then using the $S_1$ image, IPH is assessed by observing bright regions proximate to but outside the lumen boundary 606. Using the bright-blood $S_1$ image ($S_1$<0), stenosis is observed by comparing the bright-blood region with the lumen boundary obtained from $S_1$ 608. However, $S_1$ and the bright-blood $S_1$ do not provide information about the outerwall boundary.

In accordance with the process 600, the $S_2$ image can be used to determine the location of the vessel outerwall boundary 610; and by comparing the outerwall boundary and the inner wall boundary, the plaque burden can be obtained 612. A portion of the plaque burden corresponding to JCA can be determined by comparing dark regions in the $I_2$ image with the region corresponding to the plaque burden 614. Thus, each of IPH, stenosis, JCA and plaque burden can be assessed using an image set obtained from a single IR sequence.

In alternative embodiments, each of the lumen boundary and stenosis can additionally be determined using the $S_2$ image alone rather than in conjunction with the $S_1$ and bright-blood $S_1$ images. The $S_1$ images may also be used in conjunction with the $S_2$ image by a practitioner to extend the certainty of identification of these features.

Figure 7:
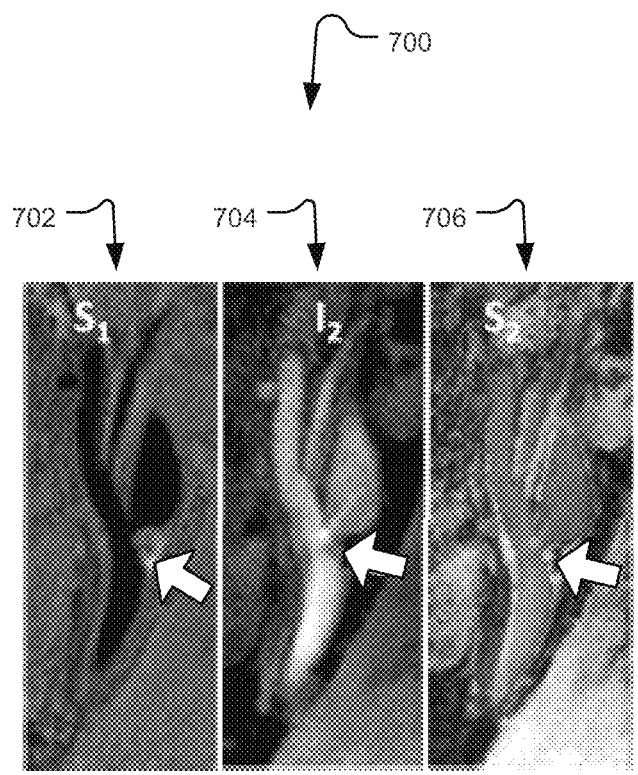
FIG. 7 is an exemplary view of an $S_1$, $I_2$, and $S_2$ image set useful for identifying calcification, in accordance with embodiments.

FIG. 7 is an exemplary view of an $S_1$, $I_2$, and $S_2$ image set 700 useful for differentiating juxtaluminal and intraplaque calcification, in accordance with embodiments. In the image set 700, a common area of interest is marked on all images. An $S_1$ image 702 shows an inner lumen boundary and, at the area of interest, a bright point likely indicative of IPH. An $I_2$ image 704 shows a dark region proximate to the bright point identifiable in the $S_1$ image, which is likely indicative of calcification. A gray-blood $S_2$ image 706 shows both the inner lumen boundary, outerwall boundary, and a dark region corresponding to calcification at the area of interest. Notably, the $S_2$ image 706 clarifies that the region of calcification is enclosed within a plaque, such that the calcification is an intraplaque calcification rather than JCA.

Figure 8:
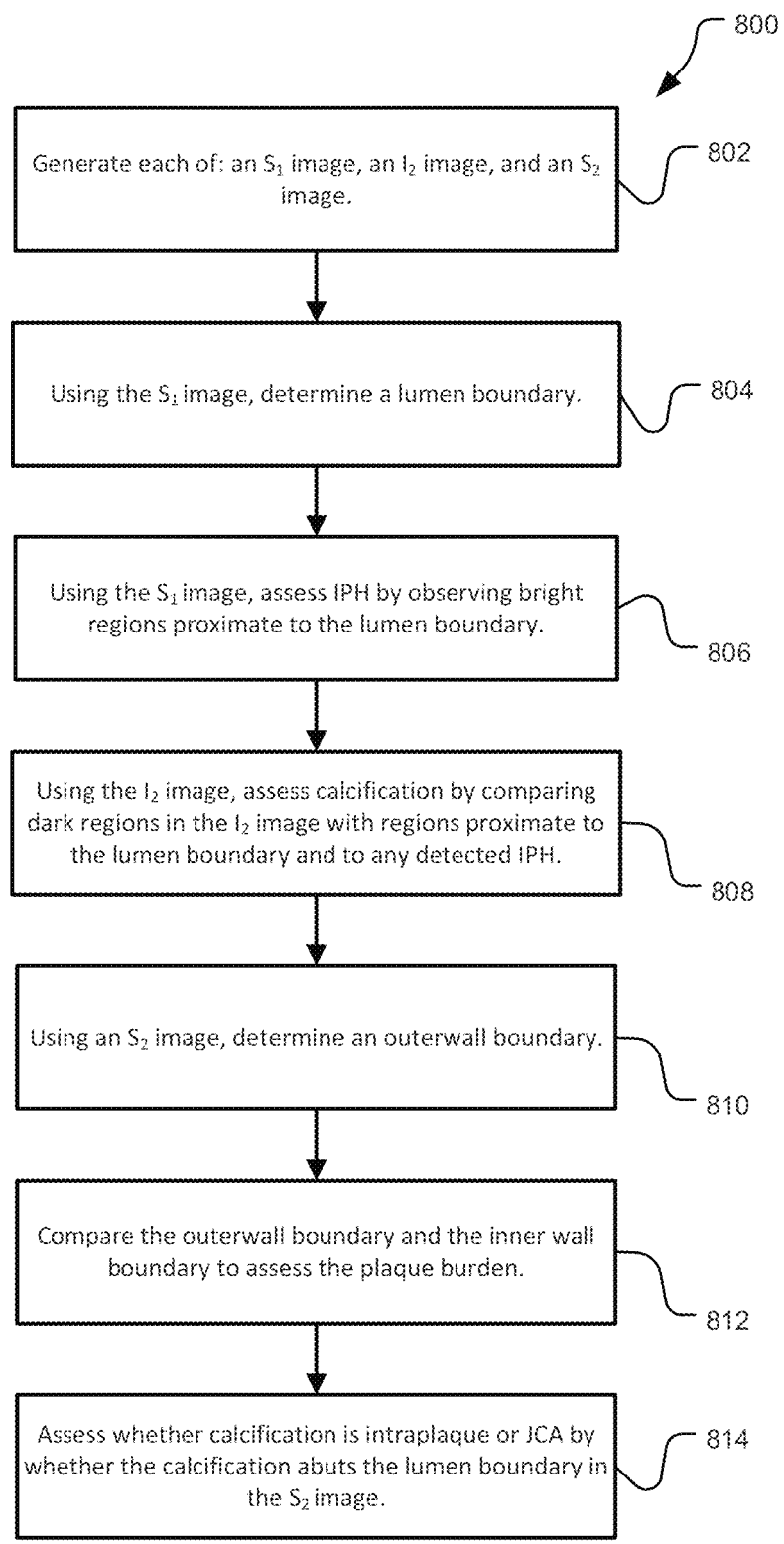
FIG. 8 is a process flow diagram showing an example process for identifying calcification and juxtaluminal calcification using $S_1$, $I_2$, and $S_2$ images, in accordance with embodiments.

FIG. 8 is a process flow diagram showing an example process 800 for differentiating juxtaluminal and intraplaque calcification referencing the image set of FIG. 7, in accordance with embodiments. In the process 800, each of $S_1$, $I_2$, and $S_2$ images 702, 704, 706 are generated 802. The $S_1$ image 702 can be used to determine a lumen boundary 802, and bright regions proximate to the lumen boundary indicate regions likely associated with IPH 806. Using the $I_2$ image 704, regions corresponding to calcification may be identified as appearing dark and proximate to but outside the lumen boundary 808. The $S_2$ image 706 can be used to identify the lumen and outerwall boundaries 810, and to determine a plaque burden 812, such that identified regions of calcification can be compared to the lumen boundary for determining whether such identified regions are, for example, intraplaque calcification or JCA that abuts the lumen boundary in $S_2$ 814. JCA status may be determined by whether the calcification is separated by intervening tissue from the gray-blood lumen visible in the $S_2$ image 706.

Figure 9:
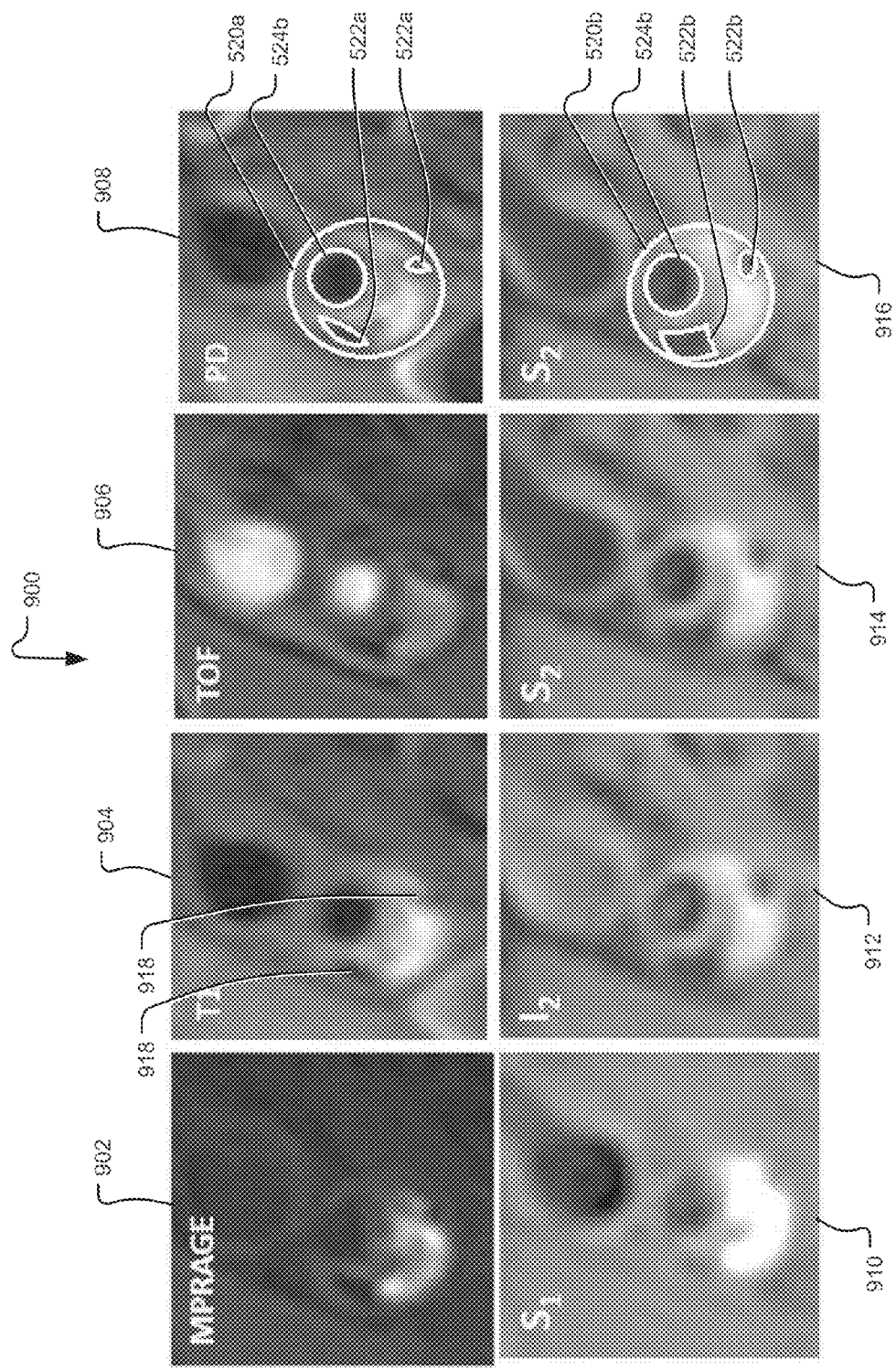
FIG. 9 is an exemplary view of two image sets including a traditional 2D multi-contrast protocol and an image set including $S_1$, $I_2$ and $S_2$ images generated according to the embodiments shown in FIGS. 1-8.

FIG. 9 is an exemplary image set 900 showing images arranged for a traditional multicontrast protocol for determining calcification (top row) for comparison against an image set including an $S_1$ image, $I_2$ image, and $S_2$ image generated according to the embodiments described in FIGS. 1-8 (bottom row). The top row of images were acquired using a traditional 2D multicontrast plaque MR imaging protocol. See, Saam et al., "The vulnerable, or high-risk, atherosclerotic plaque: noninvasive MR imaging for characterization and assessment," Radiology vol. 244(1) pages 64-77 (2007). The MPRAGE image 902 is a T1-weighted gradient-echo sequence, the T1 image 904, showing calcification sites 918, is a T1-weighted spin echo sequence, the TOF image 906 is a time-of-flight bright blood angiography sequence and the annotated PD image 908 is a proton density weighted spin echo sequence. The bottom row of images was obtained using methods disclosed above, and includes: an $S_1$ image 910, an $I_2$ 912, and an $S_2$ image 914, as well as an annotated $S_2$ image 916.

The bottom row of images in the exemplary image set 900 were obtained according to an MR protocol including the following parameters: The TR/TE (sequence repetition time/ echo time) was 10/4 ms, the flip angles α and θ were 11 degrees and 5 degrees (respectively), $TI_1$ (for obtaining the $I_1$ image) was 500 ms, and $TI_2$ (for obtaining the $I_2$ image) was 1480 ms.

The right-hand column of the exemplary image set 900 includes an annotated PD image 908 generated by the traditional 2D multicontrast protocol and the annotated $S_2$ image 916 produced by methods described above. Using each image, a trained reviewer drew outlines of relevant features for comparison, including: the outerwall boundary 520a, 520b, calcification sites 522a, 522b, and the inner lumen 524a, 524b. A sample of 210 slices were assessed for calcification, and there was good agreement (Kappa=0.1, p<0.001) between calcification status on a slice level basis between the traditional 2D multicontrast protocol and the calcium status determined using the methods herein described.

Other variations are within the spirit of the present invention. Thus, while the invention is susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions, and equivalents falling within the spirit and scope of the invention, as defined in the appended claims.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein

What is claimed is:

1. A method for using magnetic resonance imaging to identify high-risk features of atherosclerotic plaque in a single scan, the method comprising:

performing an inversion recovery gradient magnetic resonance imaging sequence by applying an inversion recovery (IR) pulse to a subject disposed in a magnetic field in an MR imaging machine;

obtaining an $I_1$ image which is T1 weighted by detecting a first magnetic resonance signal at a time $TI_1$ after the IR pulse and at an acquisition flip angle $\alpha$;

obtaining an $I_2$ image which is proton-density weighted by detecting a second magnetic resonance signal at a time $TI_2$ after the IR pulse and at an acquisition flip angle $\theta$;

obtaining a polarity map $P(x,y)$ from the $I_1$ image and the $I_2$ image according to the equation $$P(x, y) = \frac{I_1(x, y) I_2^*(x, y)}{\|I_1\| \, \|I_2\|};$$

and obtaining an $S_2$ image by reconstructing, from the $I_2$ image and the polarity map, a polarity enhanced proton-density-weighted image according to the equation $S_2(x,y)=P(x,y)\|I_2(x,y)\|$;

wherein $I_1(x,y)$ is the $I_1$ image, $I^*_2(x,y)$ is a complex conjugation of the $I_2$ image, $\|I_1\|$ is a norm of the $I_1$ image, $\|I_2\|$ is a norm of the $I_2$ image, $\|I_2(x,y)\|$ is the norm of the $I_2$ image, and $S_2(x,y)$ is the $S_2$ image.

2. The method of claim 1, further comprising:
comparing the $I_2$ image and the $S_2$ image for identifying false potential regions of calcification; and
excluding the false positive potential regions of calcification using the comparing.

3. The method of claim 1, further comprising:
determining a location of a vessel outerwall boundary using the $S_2$ image.

4. The method of claim 3, further comprising:
obtaining an $S_1$ image by reconstructing, from the $I_1$ image and the polarity map, a T1-weighted corrected real image according to the equation $S_1(x,y)=P(x,y)\|I_1(x,y)\|$;
determining the location of a vessel lumen using the $S_1$ image; and
determining a plaque burden by comparing the location of the vessel lumen with the location of the vessel outerwall boundary;
wherein $S_1(x,y)$ is the $S_1$ image.

5. A method for using magnetic resonance imaging, the method comprising:

with $I_1$ and $I_2$ images obtained from an inversion recovery (IR) magnetic resonance imaging sequence, $I_1$ being T1-weighted and $I_2$ being proton-density weighted, obtaining a polarity map $P(x,y)$ from the $I_1$ image and the $I_2$ image, the polarity map corresponding to a polarity function indicating a positive or a negative direction of magnetization associated with each of a plurality of spatial locations in the $I_1$ and $I_2$ images;

obtaining an $S_2$ image by correcting the $I_2$ image with the polarity map, such that $S_2$ is a polarity enhanced proton-density-weighted image; and outputting the $S_2$ image in a manner perceptible to a user, wherein the $S_2$ image is indicative of at least one of a calcification or a plaque burden.

6. The method of claim 5 further comprising:
obtaining the $I_1$ image and the $I_2$ image by performing an inversion recovery gradient magnetic resonance imaging sequence by applying an inversion recovery (IR) pulse to a subject disposed in a magnetic field, and detecting a first magnetic resonance signal at time $TI_1$ and a second magnetic resonance signal at a time $TI_2$, respectively.

7. The method of claim 6, wherein the time $TI_1$ is between 300 and 500 ms, and the time $TI_2$ is at least 1500 ms.

8. The method of claim 5, wherein the polarity function is defined by $$P(x, y) = \frac{I_1(x, y) I_2^*(x, y)}{\|I_1\| \, \|I_2\|}$$

when $I_1(x,y)=\|I_1(x,y)\|P(x,y)e^{-\emptyset(x,y)}$ and $I_2(x,y)=\|I_2(x,y)\|P(x,y)e^{\emptyset(x,y)}$;

wherein $\emptyset(x,y)$ denotes the total background phase; and
wherein $I_1(x,y)$ is the $I_1$ image, $I^*_2(x,y)$ is a complex conjugation of the $I_2$ image, $\|I_1\|$ is a norm of the $I_1$ image, $\|I_2\|$ is a norm of the $I_2$ image, $\|I_1(x,y)\|$ is the norm of the $I_1$ image, $\|I_2(x,y)\|$ is the norm of the $I_2$ image, and $S_2(x,y)$ is the $S_2$ image.

9. The method of claim 5, further comprising:
determining a vessel outerwall boundary using the $S_2$ image;
determining an inner lumen using the $S_2$ image; and
determining a plaque burden by comparing the vessel outerwall boundary and vessel inner lumen.

10. The method of claim 9, further comprising:
identifying a region of calcification using the $I_2$ image.

11. The method of claim 10, further comprising:
determining a juxtaluminal calcification by comparing the region of calcification to the inner lumen to determine whether the region of calcification is adjacent to the lumen.

12. The method of claim 5, further comprising:
obtaining an $S_1$ image by correcting the $I_1$ image with the polarity map, such that $S_1$ is a T1-weighted corrected real image;
obtaining a bright-blood $S_1$ image by taking a negative part of the $S_1$ image; and
determining stenosis using the bright-blood $S_1$ image.

13. The method of claim 5 further comprising:
determining a region of intraplaque hemorrhage using the $S_1$ image by identifying a bright region in the $S_1$ image proximate to the lumen.

14. The method of claim 5, further comprising:
determining stenosis using the $S_2$ image.

15. The method of claim 5, further comprising:
displaying, in a manner perceptible to a user, the $S_2$ image.

16. The method of claim 5, further comprising:
obtaining an $S_1$ image by correcting the $I_1$ image with the polarity map, such that $S_1$ is a T1-weighted corrected real image;
obtaining a bright-blood $S_1$ image by taking a negative part of the $S_1$ image; and displaying, in a manner perceptible to a user, two or more of the $S_1$ image, bright-blood $S_1$ image, $I_2$ image, and $S_2$ image in a spatially proximate configuration for comparison.

17. The method of claim 16 wherein the spatially proximate configuration comprises superimposing a partial transparency of at least one image over at least one other image.

18. A magnetic resonance (MR) imaging system for acquiring a dual acquisition from an inversion-recovery (IR) pulse and using the dual acquisition to determine features of atherosclerotic plaque, the system comprising:
   an MR imaging scanner having a static magnetic field, radio frequency (RF) emitter coils, and RF receiving coils configured for acquiring first and second MR resonance signals from a subject by applying an IR pulse; and
   a computer unit having a processor and memory, and having stored executable instructions thereon configured to perform operations comprising:
      reconstructing the first and second MR resonance signals into $I_1$ and $I_2$ images, respectively, the $I_1$ image being T1-weighted and the $I_2$ image being proton-density weighted;
      obtaining a polarity map P(x,y) from the $I_1$ image and the $I_2$ image, the polarity map corresponding to a positive or negative polarity of each of a plurality of voxels associated with the $I_1$ and $I_2$ images; and
      obtaining an $S_2$ image by correcting the $I_2$ image with the polarity map, such that $S_2$ is a polarity-enhanced proton-density-weighted image.

19. The system of claim 18, further comprising a display unit configured to output one or more MR images in a manner perceptible to a user.

20. The system of claim 18, wherein the operations further comprise:
   obtaining an $S_1$ image by correcting the $I_1$ image with the polarity map, such that the $S_1$ image is a T1-weighted corrected real image.

21. The method of claim 1, further comprising:
   outputting the $S_2$ image to one of a nontransitory storage medium or a display for a user, wherein the $S_2$ image is indicative of at least one of a calcification or a plaque burden.

* * * * *